United States Patent [19]

Hoshino et al.

[11] Patent Number: 4,713,614
[45] Date of Patent: Dec. 15, 1987

[54] METHOD OF CORRECTING THE PHASE AND SHADING IN A NUCLEAR MAGNETIC RESONANCE TOMOGRAPHIC DEVICE

[75] Inventors: Kazuya Hoshino; Hiroyuki Matsuura, both of Tokyo, Japan

[73] Assignees: Yokogawa Electric Corporation; Yokogawa Medical Systems, Limited, both of Tokyo, Japan

[21] Appl. No.: 831,342

[22] Filed: Feb. 20, 1986

[30] Foreign Application Priority Data

Feb. 25, 1985 [JP] Japan .................................. 60-35745

[51] Int. Cl.$^4$ ............................................ G01R 33/20
[52] U.S. Cl. ...................................... 324/307; 324/309
[58] Field of Search ............... 324/300, 309, 311, 312, 324/313, 314, 308, 318, 322

[56] References Cited

U.S. PATENT DOCUMENTS

| | | | |
|---|---|---|---|
| 4,425,547 | 1/1984 | Sugimoto | 324/318 |
| 4,585,992 | 4/1986 | Maudsley | 324/309 |
| 4,591,789 | 5/1986 | Glover | 324/313 |
| 4,599,565 | 7/1986 | Hoenninges | 324/309 |

Primary Examiner—Michael J. Tokar
Attorney, Agent, or Firm—Moonray Kojima

[57] ABSTRACT

A method of simultaneously correcting distortion in density due to uneven sensitivity of receiving coils, and location dependent phase distortion inherent in the system, wherein a phantom is scanned to determine echo signals, which echo signals are subjected to 2-dimensional inverse Fourier transformation, to obtain an image (Cij) and stored as it is in the form of a complex number, then the object to be examined is measured by similar operation to obtain an image (Oij) and wherein the image (Oij) is divided by computation with image (Cij) as follows $|Sij| = |Oij|/|Cij|$, by which equation computation is made to correct for density distortion, and wherein the angle of deviation is set as follows arg $[Sij] = \arg[Oij] - \arg[Cij] \equiv 0$, by which equation computation is made to correct for phase distortion. An image of the object is thus obtained which is corrected for density distortion and for phase distortion, by taking the real number part of the image Sij which is the determined image of the object.

1 Claim, 2 Drawing Figures

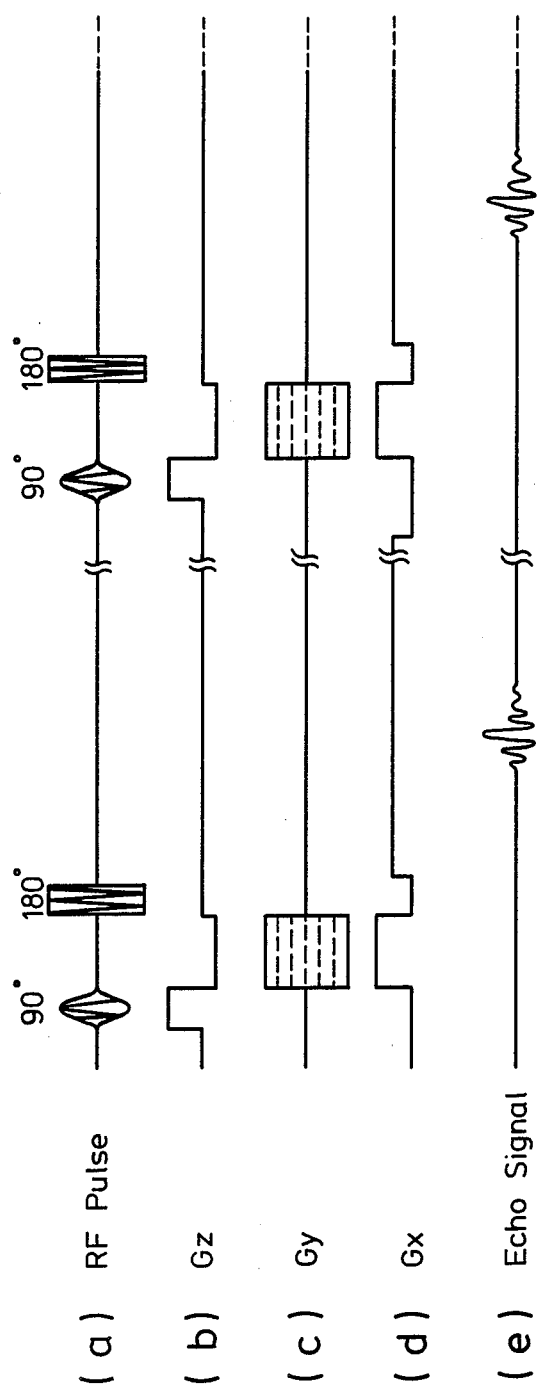

METHOD OF CORRECTING THE PHASE AND SHADING IN A NUCLEAR MAGNETIC RESONANCE TOMOGRAPHIC DEVICE

BACKGROUND OF THE INVENTION

1. Field of Invention

This invention relates to a method of improving the image quality in a nuclear magnetic resonance (hereinafter called "NMR") tomographic device.

2. Description of the Prior Art

In a NMR tomographic device, it is necessary to correct for phase distortion of data resulting from the characteristics of the device upon re-constituting an image. One of the typical scanning methods used in NMR is the Fourier method, wherein phase correction is exclusively conducted by computation for absolute value. That is, assuming the real part is Rij and the imaginary part is Zij, for the image data represented by the complex number obtained by subjecting the scanned data to a 2-dimensional inverse Fourier transformation, an iamge Pij to be displayed is usually calculated as follows $$Pij = \sqrt{R^2ij + Z^2ij}$$

wherein i, j represent piccel numbers.

In this method, however, in case of a pulse sequence where negative data are obtained, as in the inversion recovery method (IR method), the data are turned back to the positive side which results in difficult observation of the image. In view of the foregoing, in a phase stable system, a phase $\theta$ can be previously determined under the same condition by some appropriate means and correction can be made using the phase $\theta$ as follows $$Pij = Rij \cdot \cos\theta + Zij \cdot \sin\theta$$

However, since the magnitude of rotation of the phase is generally location dependent (which can not be corrected completely by this method) there occurs an undesired shading in the image, and density distortion due to uneven sensitivity of receiving coils or the like. These cannot be readily corrected.

SUMMARY OF THE INVENTION

Accordingly, an object of the invention is to overcome the aforementioned and other deficiencies and disadvantages of the prior art.

Another object is to provide a correction method capable of improving the quality of a reconstituted image by simultaneously correcting distortion in the phase, including location dependent phase distortion inherent to the system, and distortion in the density due to uneven sensitivity of the receiving coils or like.

A feature of the invention is the correcting of the reconstituted data by use of a phantom, reconstituted through scanning, in the form of a complex number, thereby to attain the aforementioned and other objects of the invention.

BRIEF DESCRIPTION OF DRAWINGS

FIG. 2 is a chart depicting the pulse sequence used in the embodiment of FIG. 1.

DETAILED DESCRIPTION OF PREFERRED EMBODIMENTS

Figure 1:
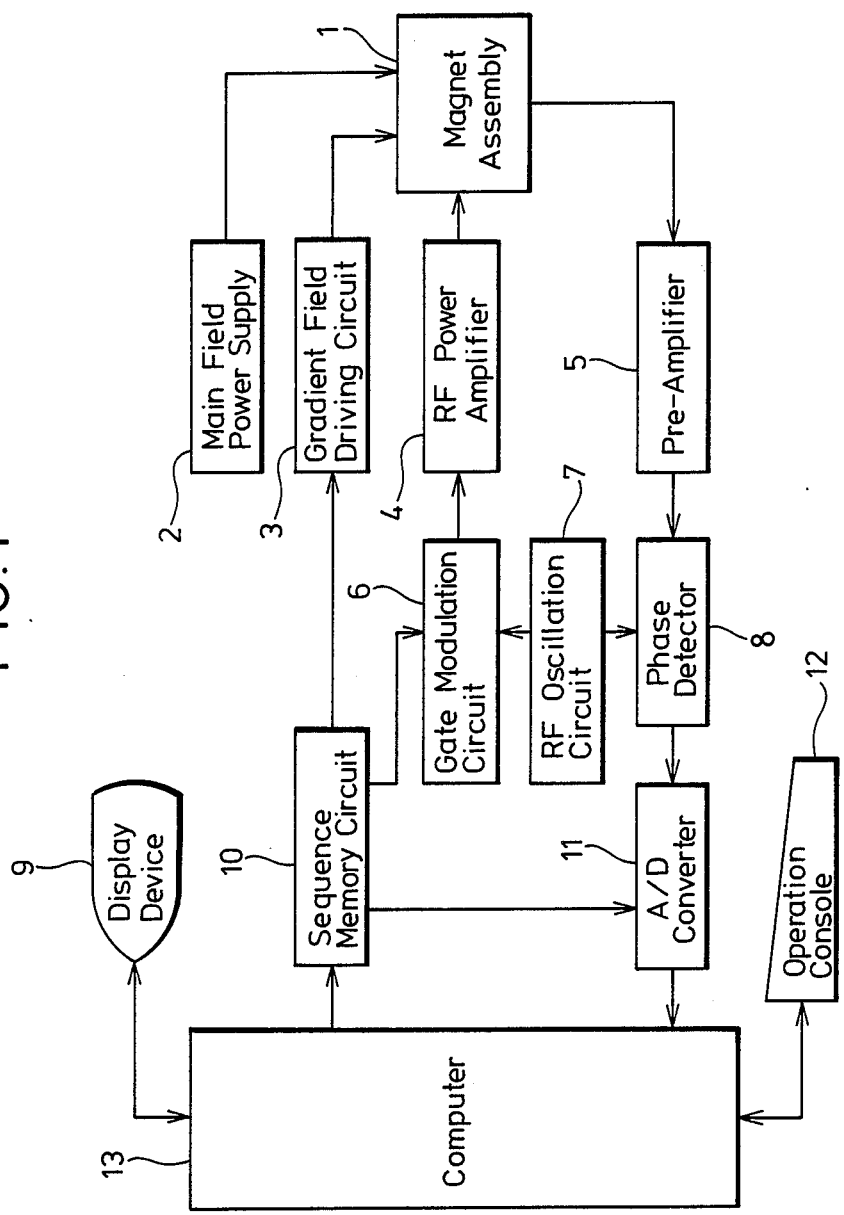
FIG. 1 is a block diagram depicting an illustrative embodiment of the invention.

FIG. 1 depicts a portion of a NMR tomographic device comprising a magnetic assembly 1 having a space portion, such as a hollow hole, for inserting therein an object to be examined, and a plurality of windings. The details of the magnet assembly are not shown in the drawing because they are well known in the art. In such an assembly, surrounding the space portion are disposed a main field coil for applying a constant magnetic field to the object, gradient field coils for generating gradient magnetic fields (comprising x-gradient field coil, y-gradient field coil and z-gradient field coil arranged to produce individual gradient magentic fields), an RF transmission coil giving RF pulses for exciting the spin of atomic nuclei in the object and a receiving coil for detecting the NMR signals from the object.

The main field coils, each of gradient field coils Gx, Gy, Gz, RF transmission coil, and NMR signal receiving coil, are respectively connected to a main field power source 2, Gx,Gy,Gz gradient field driver 3, RF power amplifier 4 and pre-amplifier 5, as depicted. A sequence memory circuit 10 is provided for controlling the sequence of generating the gradient magnetic fields, via circuit 3, and RF magnetic field, via a gate modulation circuit 6 and circuit 4, as well as controlling the timing of A/D (analog to digital) conversion of the obtained NMR signals, via converter 11.

Gate modulation circuit 6 and RF oscillation circuit 7 are provided, as depicted. Gate modulation circuit 6 modulates RF signals generated from the output of RF soscillation circuit 7 to form RF pulses as affected by the timing signals from sequence memory circuit 10. The resulting RF pulses are applied to RF power amplifier 4, which is connected to the RF transmission coil of the magnetic assembly 1.

A phase detector 8 conducts phase detection for the NMR signals which are detected by the receiving coil of magnet assembly 1 and sent by way of preamplifier 5, while referring to the output signal from RF oscillation circuit 7.

An A/D converter 11 conducts analog to digital conversion of the NMR signals obtained by the phase detector 8, as affected by timing signals from sequence memory circuit 10.

A computer 13 is suitably programmed for sending and receiving information to and from an operation console 12, for rewriting contents in sequence memory circuit 10 to realize various scan sequences and for reconstituting the information distribution regarding the resonance energy from the measured data inputted from A/D converter 11, into an image. The reconstituted image is then displayed on display device 9.

The operation of the embodiment will now be explained with reference to the waveform chart of FIG. 2 which shows one example of pulse sequences. The pulse sequence will be first explained. The 90° pulses shown in line (a) are obtained under control of sequence memory circuit 10 and by way of gate modulation circuit 6, which are applied by way of RF power amplifier 4 to the RF transmission coil of magnet assembly 1, to excite an object to be examined. In this case, a gradient magnetic field Gz is also applied at the same time (as shown in line (b)) to selectively excite only the spins present within the specific slice plane.

Then, phase encoding is conducted by gradient magnetic field Gy and a gradient magnetic field Gx is applied simultaneously (as shown in line (d)) to prepare for measurement of the echoes.

Subsequently, application of the gradient magnetic field is interrupted and 180° pulses (see line (a)) are applied to invert the spin. Then, while applying magnetic field Gx, the echo signals generated (see line (e)) are detected by the receiving coil of magnetic assembly 1 and observed. The spin echo signals detected by the receiving coil are sent by way of preamplifier 5, phase detector 8, and A/D convertor 11 to computer 13.

The echo signals thus obtained correspond to one line subjected to 2-dimensional Fourier transformation of the spin density distribution within the sliced plane. Accordingly, a reconstituted image can be obtained by sampling a series of data while varying the magnitude of gradient magnetic field Gy, that is, the magnitude of the phase encoding on every view and subjecting the data to 2-dimensional inverse Fourier transformation.

The correction is carried out by the following procedure in such a pulse sequence, provided that the amplitude and phase characteristics are stable.

Step 1. A phantom for use in the correction, is set in the magnetic asembly. Usually, a water phantom capable of sufficiently covering the image pick-up region is used as the phantom. The phantom is scanned with the same thickness as the slice and at the same position for slicing (position in the z-axis direction) as those in the actual scan and the echo signals thus obtained are subjected to the 2-dimensional inverse Fourier transformation. The results ($C'_{ij}$) are standardized with the absolute value for the picture element at the center, or alternatively, for the picture element with the greatest amplitude, and then stored as they are in the form of a complex number in computer 13. The data $C_{ij}$ are represented as follows $$C_{ij} = C'_{ij} / |C_{pq}| \tag{1}$$

wherein p,q are suffixes representing the picture element at the center of the screen or the picture element with the greatest amplitude.

Step 2. An actual object to be examined is scanned and subjected to the same data processing as in Step 1, to obtain $O_{ij}$.

Step 3. Then, correction is conducted by the following computation (the calculation is carried out on the basis of the complex number).

$$S_{ij} = O_{ij} / C_{ij} \tag{2}$$

the equation can be represented by absolute values, and the angle of deviation is as follows $$|S_{ij}| = |O_{ij}| / |C_{ij}| \tag{3}$$

$$\arg[S_{ij}] = \arg[O_{ij}] - \arg[C_{ij}] = 0 \tag{4}$$

It is shown that compensation is conducted for distortion of density by equation (3) and for distortion in phase by equation (4), respectively.

Finally, an image $P_{ij}$ can be obtained by taking only the real part of $S_{ij}$ as follows $$P_{ij} = RE[S_{ij}] \tag{5}$$

If the $C_{ij}$ are used as they are for correction, noises contained in $S_{ij}$ may some time be increased as compared with those in $O_{ij}$ due to the effect of noises contained in $C_{ij}$. Since the location dependent change in phase distortion and density distortion are relatively moderate, it is possible, by appropriately smoothing $C_{ij}$, to reduce only the noises by so much, while leaving the information for phase distortion and density distortion as they are. In view of the foregoing factors, it is actually desirable to employ, instead of $C_{ij}$, the following $$B_{ij} = LPF[C_{ij}] \tag{6}$$

wherein LPF [$C_{ij}$] means to apply smoothing independently for the real part of $C_{ij}$ and for the imaginary part of $C_{ij}$.

In this way, phase distortion and density distortion can be corrected simultaneously.

The method of this invention, advantageously, can be expanded with ease to a three dimensional case, wherein scanning and reconstitution may be conducted by Fourier process. Furthermore, advantageously, by previously determining only data for use in correcting in a 3-dimensional method, the 3-dimensional Fourier process can be used to calculate 2-dimensional correcting data corresponding to any desired sliced plane. Moreover, the invention can be applied to any scanning system provided it belongs to the Fourier process.

As has been described, this invention can even correct location dependent phase distortion. Also, those areas taking negative values can be represented exactly without turning back to the positive side. Moreover, advantageously, satisfactory images can be obtained which do not suffer from undesired shading resulting from insufficiency of phase correction and from density distortion caused by uneven sensitivity of the receiving coil or the like.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A method of correcting phase and shading in a nuclear magnetic resonance tomographic device, comprising the steps of
    scanning a phantom to measure signals, subjecting said signals to a 2-dimensional inverse Fourier transformation by computer means and storing an image ($C_{ij}$) thus obtained as it is in the form of a complex number in a memory means;
    measuring an object to be examined by the same operational steps as recited in the foregoing steps and applying data processing to obtain an image ($O_{ij}$) in the form of a complex number;
    wherein said object and said phantom are placed in the same physical position during respective measurements; and
    dividing the image ($O_{ij}$) of said object with said image ($C_{ij}$) of said phantom by the computer means, to correct distortion in the density of the image of the object and simultaneously correct distortion in the phase of the image of the object, thereby obtaining an image of the object corrected for distortion in density and distortion in phase.

* * * * *